United States Patent [19]

Rusznyak

[11] Patent Number: 5,339,045
[45] Date of Patent: Aug. 16, 1994

[54] COMPARATOR START-UP ARRANGEMENT

[75] Inventor: Andreas Rusznyak, Chene-Bougeries, Switzerland

[73] Assignee: Motorola, Inc., Schaumburg, Ill.

[21] Appl. No.: 980,037

[22] Filed: Nov. 23, 1992

[30] Foreign Application Priority Data

Dec. 20, 1991 [GB] United Kingdom ............ 9127085.0

[51] Int. Cl.⁵ .............................................. H03F 3/45
[52] U.S. Cl. .................................. 330/253; 330/261; 327/356
[58] Field of Search ...................... 330/253, 257, 261; 307/355, 356, 272.3, 296.3

[56] References Cited

PUBLICATIONS

DeGrauwe et al., "CMOS Adaptive Biasing Amplifier", Conference: ESS Circ '81, Seventh European Solid-State Circuits Conference, Freiburg, Germany. Sep. 22-24, 1981.

Primary Examiner—James B. Mullins
Attorney, Agent, or Firm—Harry A. Wolin

[57] ABSTRACT

A circuit including an operational amplifier (A) having an input stage comprising first and second transistors (10, 12) coupled in differential configuration and being powered by a first current source (20), the current source being powered by the output of the operational amplifier, wherein in order to ensure start up of the amplifier a second current source (34) is coupled to the differential pair of transistors, wherein a sensing means (40, 42) is provided responsive to the inputs of the operational amplifier and arranged to control energization of the second current source in order to switch off the second current source after switch on of the amplifier.

9 Claims, 4 Drawing Sheets

COMPARATOR START-UP ARRANGEMENT

FIELD OF THE INVENTION

The present invention relates to a start-up circuit for devices such as comparators employed in stable current sources.

BACKGROUND ART

Referring to FIG. 1, a known current source circuit is shown for generating a current I having stable value for use in an integrated circuit. The circuit comprises a voltage divider network R1, R2 connected between supply rail VDD and reference potential rail GND providing a reference voltage V at node B coupled to the inverting input of an operational amplifier A. The output of the amplifier is coupled to the gate of transistor 2 and the gates of transistors 4,6. The transistor 2 is connected via a connection node IN to a current sink device and supplies current I thereto. The current sink device comprises an externally mounted resistor R of precise value. Connection node IN is coupled to the non-inverting input of amplifier A. Amplifier A ensures that the voltage at the non-inverting input of the amplifier will also be V, hence the current I through the resistor R will be precisely determined as V/R. Currents flowing through transistors 4, 6 which are coupled to loads (not shown) are proportional to current I and constitute the output of the circuit. The operational amplifier A is realised in CMOS technology and includes a current source 8 within the tail of a differential pair of transistors 10, 12 forming the input stage of the amplifier.

In the following description of the drawings, similar parts to those of FIG. 1 are denoted by the same reference numerals.

To ensure accuracy of operation and to ease constraints on the operational amplifier used in the circuit shown in FIG. 1, the arrangement shown in FIG. 2 is frequently employed. The current source 8 is provided by a transistor 20 controlled via transistors 4, 22 in a current mirror arrangement. The problem with this arrangement is that it may not start up upon initial switch on, since the drive for the current source 8 is dependent upon the output of the amplifier.

In order to ensure switch on the circuit of FIG. 2, the start up arrangement as shown in FIG. 3 has been used in the past. As shown in FIG. 3 transistors 30 and 32 are connected between the power supply VDD and ground GND with the gate of transistor 30 coupled to the reference potential. This ensures that transistors 30 and 32 carry current at start up. Current through transistor 32 is mirrored by a transistor 34 which is coupled in parallel with transistor 20 to ensure that the amplifier has start up current upon switch on of the device A. Transistor 36 is provided in order to switch off transistor 34 upon switch on of the device.

The arrangement shown in FIG. 3 has, however, the disadvantage that transistors 30 and 36 remain on throughout the operation of the comparator increasing overall power consumption in the device. Another disadvantage of the described comparator is that the on chip voltage divider R1,R2 generating reference voltage V contributes also to power consumption even if the comparator is not in use, i.e. when node IN is not connected to resistor R.

SUMMARY OF THE INVENTION

It is an object of the invention to avoid or at least reduce the above mentioned disadvantages.

The present invention provides a circuit including an operational amplifier having a stage comprising first and second transistors coupled in differential configuration and being powered by a first current source, the current source being powered by the output of the operational amplifier, wherein in order to ensure start up of the amplifier a second current source is connected to the differential pair of transistors, wherein a sensing means is provided responsive to the inputs of the operational amplifier and arranged to control energisation of the second current source in order to switch off the second current source after switch on of the amplifier.

More specifically, the invention provides a comparator circuit for providing a stable source of current, the comparator circuit including a circuit as aforesaid, wherein a first input of the operational amplifier is connected to a voltage divider network coupled to the power supply of the amplifier, and the second input of the operational amplifier is coupled to a reference current sink means which is coupled to receive current derived from the output of the amplifier, wherein the sensing means is across the first and second inputs of the amplifier.

As preferred the sensing transistor comprises a transistor with its gate connected to one amplifier input and its source or drain coupled to the other amplifier input.

As preferred, a transistor switch means is provided coupled to the voltage divider network and responsive to the output of the operational amplifier in order to switch on the voltage divider after switch on of the amplifier.

BRIEF DESCRIPTION OF THE DRAWINGS

A preferred embodiment of invention will now be described with reference to the accompanying drawings wherein.

DESCRIPTION OF THE PREFERRED EMBODIMENTS

Figure 1:
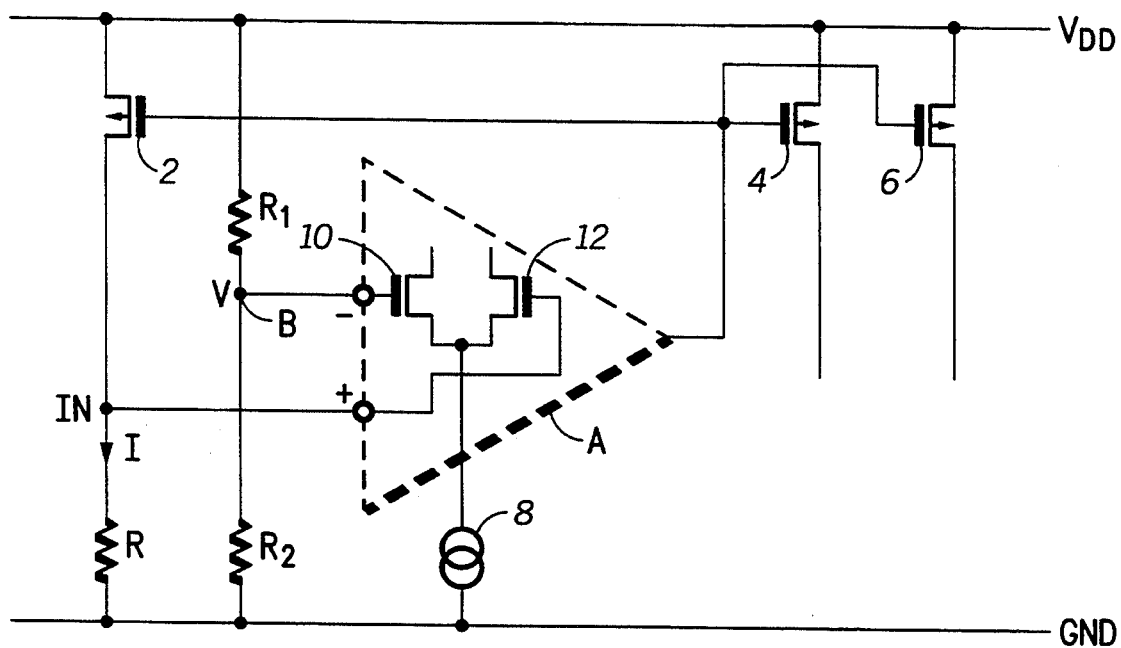
FIGS. 1, 2 and 3 are known designs of a comparator circuit including an operational amplifier and providing a stable current source for an integrated circuit.
Figure 2:
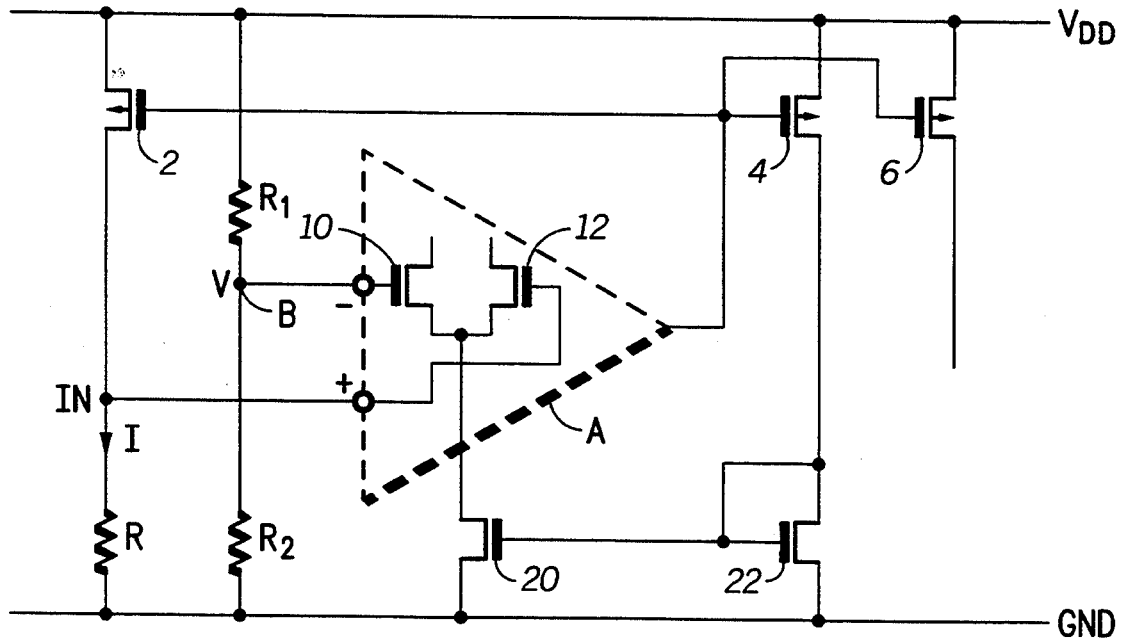
Figure 3:
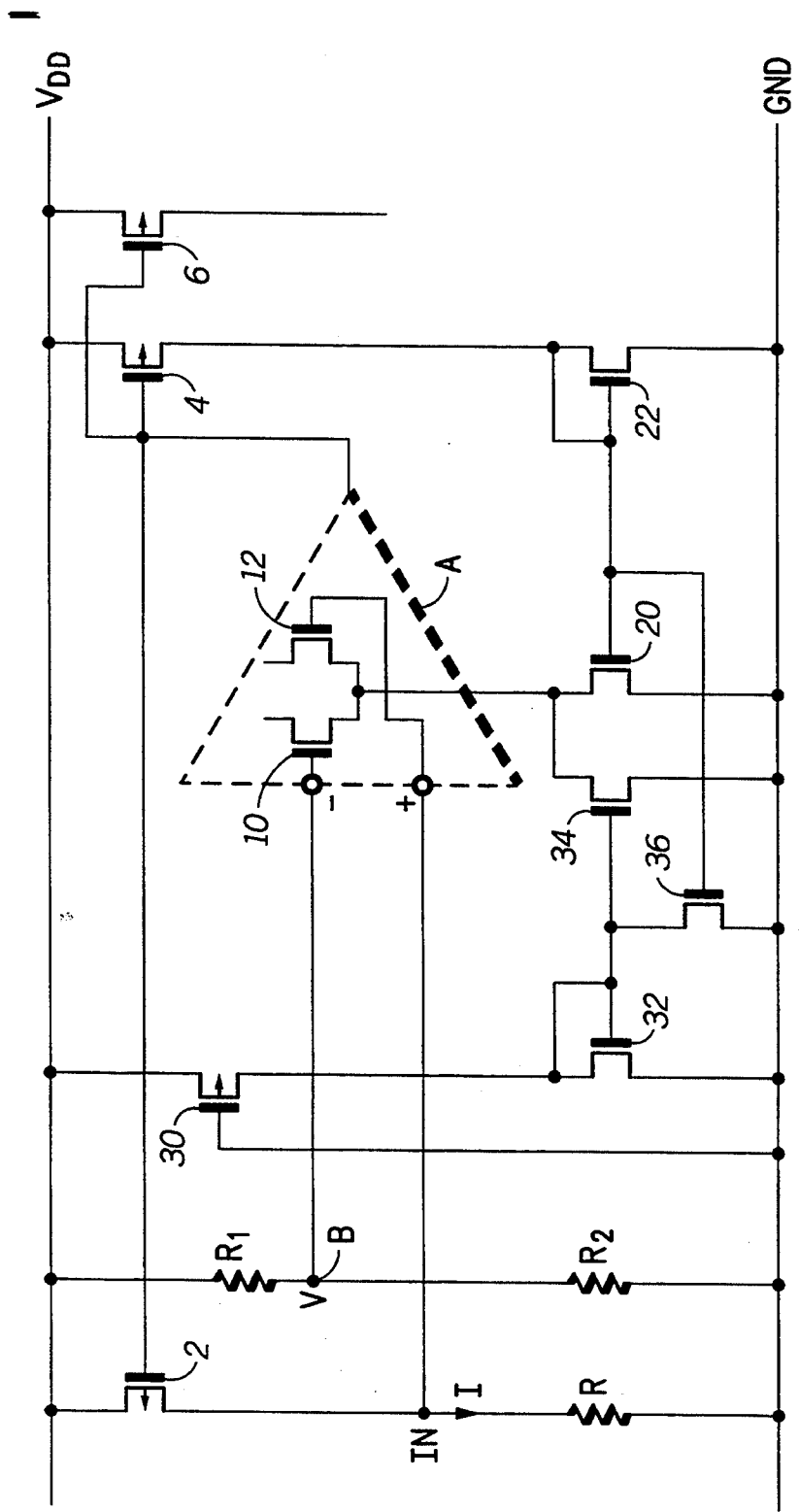
Figure 4:
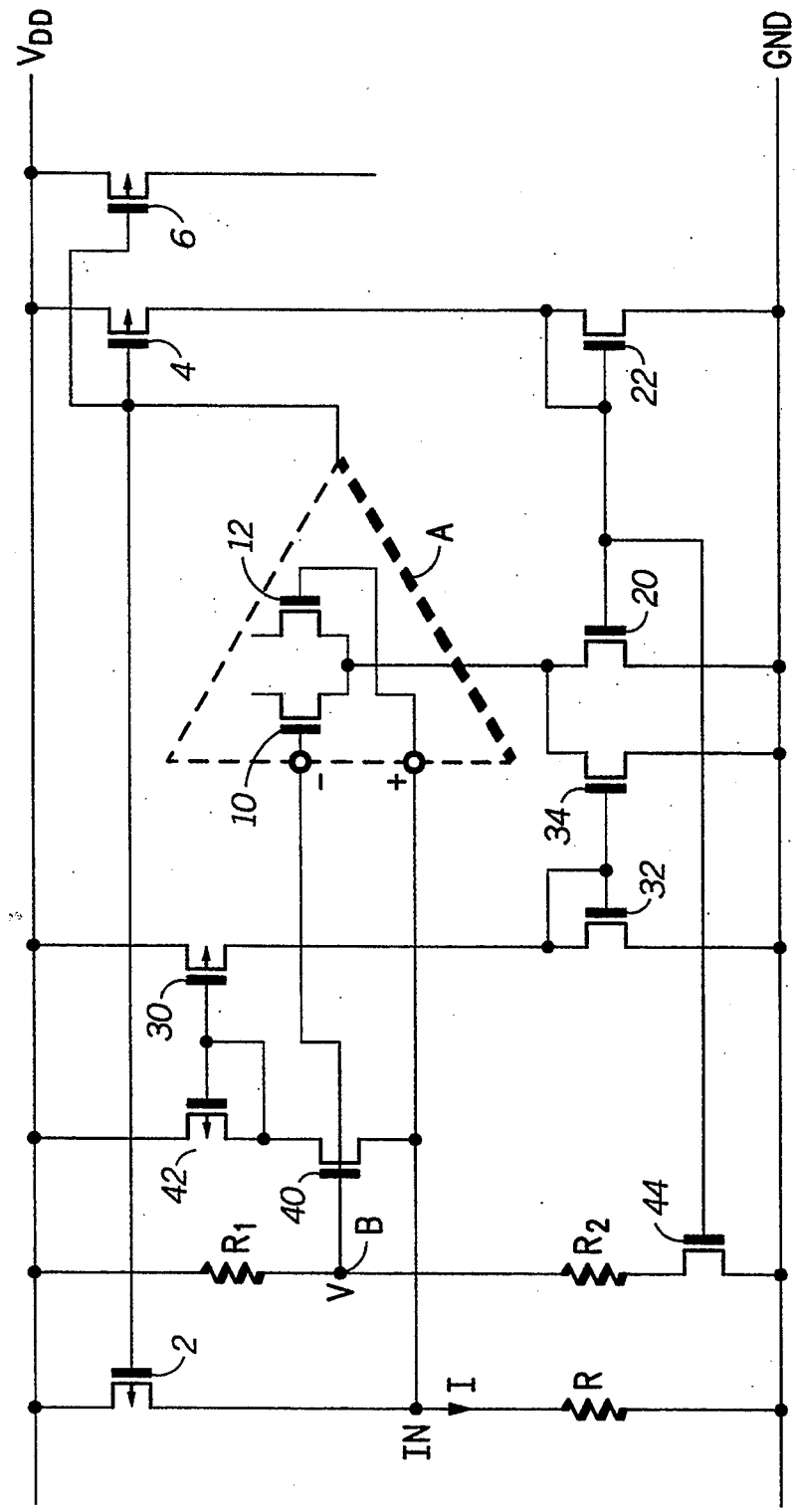
FIGS. 4 and 5 are circuit diagrams of a first and second embodiments of the present invention.

Referring now to FIG. 4 of the drawings similar parts to those shown in FIG. 3 are indicated by the same reference numeral. A sensing transistor 40 is coupled with its main current path in series with a transistor 42 which is connected in current mirror configuration with transistor 30. The gate of transistor 40 is coupled to the voltage node B in the voltage dividing network R1, R2 and to the inverting input of the amplifier, and the source of transistor 40 is coupled to the non-inverting input of amplifier A. A switch transistor 44 has its gate coupled to that of transistor 20 and its main current path in series with resistances R1, R2.

Thus in operation, upon initial start-up current is supplied to amplifier A employing transistor 34 as current source, transistor 34 being controlled by transistor 40 (current flowing through resistance R) via transistors 42, 30, 32. After an interval of time in which amplifier A becomes operative, divider network R1,R2 will be switched on by transistors 4,22,44. Current from source transistor 2 causes the voltage across resistor R to rise to voltage level V, the transistor 40 is switched off because its gate and source are at the same voltage, which has the effect of switching off transistor 42 and hence, via the current mirror arrangements, switches off transistors 30, 32, 34.

In other words, if during start-up transistor 2 does not generate a current, the non-inverting input of amplifier A will remain at ground level. On its inverting input voltage V will rise. Transistor 40 will become conductive when voltage V is greater than its threshold voltage. The current through transistor 40 is mirrored through transistors 42, 30, 32 and 34 to supply the operational amplifier. The amplifier now operative will switch on transistor 44 and transistor 2 causing the voltage at node IN to rise to level V, which will turn off transistor 40 and hence the transistor chain 42, 30, 32 and 34.

Figure 5:
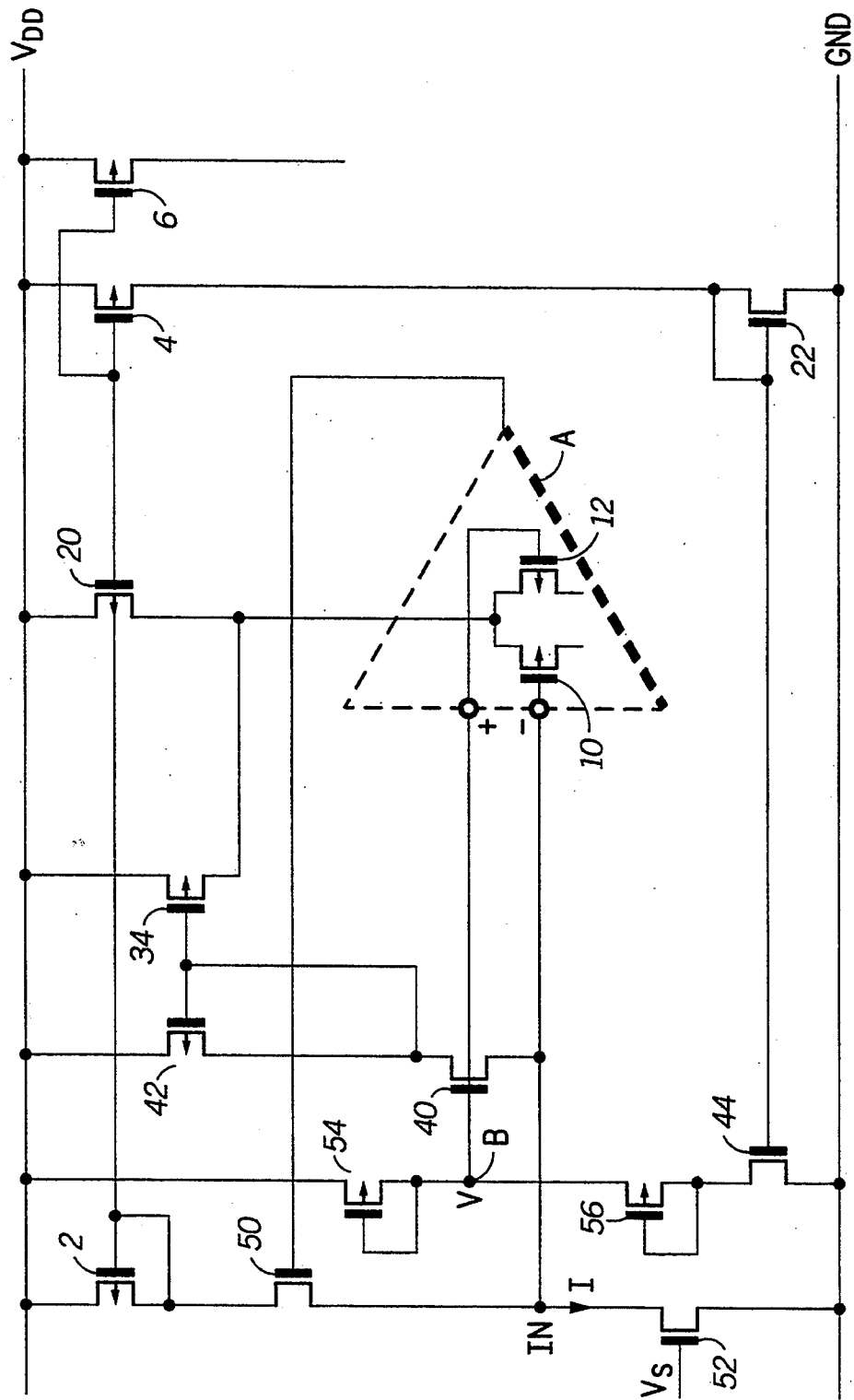

Referring now to the second embodiment shown in FIG. 5, the output of amplifier A is connected to the gate of a follower transistor 50, whose main current path is connected in series with that of transistor 2. Transistor 50 is of opposite conductivity type to that of transistor 2. Current source transistor 20 has its gate connected in common with those of transistor 2, 4 and 6. Transistor 50 is coupled in series to a current sink transistor 52, having a reference voltage VS connected to its gate. A voltage divider network provides voltage V on node B and comprises two transistors 54, 56 connected in diode configuration.

In operation, upon initial start-up amplifier A is energized by transistors 52, 40, 42, 34. The output of amplifier A provides current in transistors 50, 2, 20, 4, 22, 44. Voltage divider network is switched on by transistor 44 and provides voltage V to the non-inverting input of amplifier A. The voltage on the node IN connected to the inverting input of amplifier A rises and approaches voltage V, whereby transistors 40 and 42 are switched off, thereby switching off transistor 34. Thus the effect is that amplifier A is now powered by current source 20, and the transistors 40, 42, 34 are switched off.

Modifications and variations of the above embodiments are possible; for example transistor 44 may be replaced by a direct connection although this entails the disadvantage of permanent current flow through the voltage divider network.

I claim:

1. A circuit including an operational amplifier having first and second inputs and an output and including an input stage comprising first and second transistors coupled in differential configuration and being powered by a first current source, the first current source being powered from the output of the operational amplifier, wherein, in order to ensure start up of the amplifier, a second current source is coupled to the differential pair of transistors, and a sensing means is coupled across the first and second inputs of the operational amplifier and arranged to control energisation of the second current source in order to switch off the second current source after switch on of the amplifier.

2. A comparator circuit for providing a stable source of current, the comparator circuit including a circuit as claimed in claim 1, wherein the first input of the operational amplifier is connected to a voltage divider network, and the second input of the operational amplifier is coupled to a reference current sink means which is coupled to receive current derived from the output of the amplifier.

3. A circuit as claimed in claim 2 wherein the sensing means comprises a transistor with its gate connected to one of the first and second inputs of the operational amplifier and its source or drain coupled to the other of the first and second inputs of the operational amplifier.

4. A circuit as claimed in claim 2 including a current mirror means coupled to the sensing means for powering the second current source.

5. A circuit as claimed in claim 2 including switch means coupled to the voltage divider network and responsive to the output of the operational amplifier in order to switch on the voltage divider network after switch-on of the amplifier.

6. A circuit as claimed in claim 2 wherein the reference current sink means comprises a resistance of predetermined value.

7. A circuit as claimed in claim 2 wherein the voltage divider network comprises a chain of resistances.

8. A circuit as claimed in claim 2 wherein the reference current sink means comprises a transistor having its gate coupled to a reference voltage.

9. A circuit as claimed in claim 2 wherein the voltage divider network comprises a chain of transistors connected in diode configuration.

* * * * *